United States Patent
Sakata

(10) Patent No.: US 7,695,888 B2
(45) Date of Patent: *Apr. 13, 2010

(54) PHOTOSENSITIVE LITHOGRAPHIC PRINTING PLATE

(75) Inventor: Kaku Sakata, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 427 days.

This patent is subject to a terminal disclaimer.

(21) Appl. No.: 11/358,124

(22) Filed: Feb. 22, 2006

(65) Prior Publication Data

US 2006/0188814 A1    Aug. 24, 2006

(30) Foreign Application Priority Data

Feb. 22, 2005    (JP)    ............... P.2005-045910

(51) Int. Cl.
*G03F 7/004*    (2006.01)
(52) U.S. Cl. ............. 430/270.1; 430/271.1; 430/302
(58) Field of Classification Search ......... 430/270.1, 430/273.1, 281.1, 300, 302
See application file for complete search history.

(56) References Cited

U.S. PATENT DOCUMENTS

| | | | |
|---|---|---|---|
| 4,657,942 A | | 4/1987 | Iwasaki et al. |
| 4,837,106 A | * | 6/1989 | Ishikawa et al. ......... 430/138 |
| 5,112,721 A | * | 5/1992 | Kuchta .................. 430/281.1 |
| 5,792,601 A | * | 8/1998 | Edwards et al. ......... 430/567 |
| 6,884,568 B2 | * | 4/2005 | Timpe et al. ............. 430/284.1 |
| 7,041,416 B2 | * | 5/2006 | Wakata et al. ............. 430/5 |
| 7,252,926 B2 | * | 8/2007 | Kuroki ................... 430/270.1 |
| 2003/0129504 A1 | * | 7/2003 | Wakata et al. ............. 430/5 |
| 2006/0068328 A1 | * | 3/2006 | Arimura et al. ......... 430/300 |
| 2007/0148583 A1 | * | 6/2007 | Timpe et al. ............ 430/270.1 |

FOREIGN PATENT DOCUMENTS

| | | |
|---|---|---|
| EP | 1 471 387 A2 | 10/2004 |
| JP | 2003-43703 A | 2/2003 |
| WO | 2004/049068 A1 | 6/2004 |

OTHER PUBLICATIONS

Extended European Search Report dated Sep. 8, 2009.

* cited by examiner

*Primary Examiner*—Cynthia H Kelly
*Assistant Examiner*—Anca Eoff
(74) *Attorney, Agent, or Firm*—Sughrue Mion, PLLC

(57) ABSTRACT

A photosensitive lithographic printing plate comprising a hydrophilic support and a photopolymerizable photosensitive layer containing: (i) a sensitizing dye having an absorption maximum in a wavelength range of from 360 to 450 nm; (ii) a hexaarylbisimidazole compound; (iii) an addition polymerizable compound having an ethylenically unsaturated double bond; (iv) a binder polymer; and (v) a mercapto compound represented by the following formula (1) as defined herein.

10 Claims, No Drawings

PHOTOSENSITIVE LITHOGRAPHIC PRINTING PLATE

FIELD OF THE INVENTION

The present invention relates to a photosensitive lithographic printing plate, and more particularly to a photosensitive lithographic printing plate suitable for conducting drawing with a laser beam and suitable for high definition AM screen printing of screen line number of 200 or more or FM screen printing.

BACKGROUND OF THE INVENTION

Photosensitive lithographic printing plates conventionally comprise a photosensitive resin layer provided on a support having a hydrophilic surface. As for the plate-making method thereof, the photosensitive lithographic printing plate is ordinarily subjected to open frame exposure (mask exposure) via a lith film and then removal of the non-image area with a developer to obtain a desired printing plate. However, with the recent progress of digitized techniques, a computer-to-plate (CTP) technique of directly conducting exposure process on the surface of the plate by scanning according to digitized image data with highly convergent light, for example, a laser beam without using a lith film has been developed. Photosensitive lithographic printing plates adapted for the technique have also been developed.

As the photosensitive lithographic printing plates suitable for exposure with a laser beam, photosensitive lithographic printing plates having a polymerizable photosensitive layer are exemplified. Because the polymerizable photosensitive layer is easily enable to increase sensitivity by appropriately selecting a polymerization initiator or a polymerization initiation system (hereinafter also simply referred to as an "initiator" and an "initiation system", respectively) in comparison with other conventional photosensitive layers.

However, when an image is drawn on such a photosensitive lithographic printing plate with a laser beam, a region of insufficient polymerization is formed in the edge of image due to an inadequate exposure amount depending on an energy distribution profile of the laser beam. Thus, sharpness of the edge of image is impaired, resulting in decrease in resolution. Also, in the region of insufficient polymerization formed in the edge of image, defect of removal occurs depending on alkali concentration of a developer or condition of a developing brush in a development processing step to cause a large variation of halftone dot area in a printing plate formed.

Moreover, since such a photosensitive lithographic printing plate comprises a support having a roughened surface according to electrolytic treatment or brush treatment in order to ensure hydrophilicity, image quality and sharpness are additionally injured and reproducibility in the shadow area is severely degraded due to scattering of reflection light at the laser exposure.

On the other hand, requirements for the high definition AM screen printing or FM screen printing have recently increased in the field of CTP technique. Therefore, the resolution of lithographic printing plate becomes an important performance.

The FM (Frequency Modulation) screen comprises fine halftone dots of approximately 20 microns irregularly arranged irrespective of screen angle and line number and expresses density gradation by halftone dot density per unit area. The features of FM screen print are that interference moire and rosette pattern do not occur, that tone jump in a halftone area of approximately 50% is avoided, and that due to the small size of halftone dot, overlap of halftone dots decreases so that the color reproduced can be brilliantly seen.

In contrast to the FM screen, the AM (Amplitude Modulation) screen comprises fine halftone dots regularly arranged at a certain angle and expresses density gradation by size of halftone dot per unit area. In Japan, a line number of the AM screen is ordinarily 175 lines per inch. On the other hand, printing using a screen line number of 200 or more is defined as the high definition AM screen printing.

The characteristics of high definition print include decreases in the moire and rosette pattern, improvement in texture of image and improvements in feeling of reality and reproducibility of detail.

However, photosensitive lithographic printing plates accompanying the degradation of reproducibility in the shadow area, for example, the photosensitive lithographic printing plates having a polymerizable photosensitive layer described above are difficult to use for the purpose of providing printing plates suitable for the high definition AM screen printing or FM screen printing, because they cannot reproduce extremely fine halftone dots.

In JP-A-2003-43703 (the term "JP-A" as used herein means an "unexamined published Japanese patent application"), a photosensitive lithographic printing plate comprising a support having provided thereon an intermediate layer containing a polymer compound including a constituent unit having a sulfonic acid group in its side chain and a photopolymerizable photosensitive layer in order is described. However, the photosensitive lithographic printing plate is still insufficient for a printing plate precursor-suitable for the high definition AM screen printing or FM screen printing. Particularly, since unevenness of halftone dot with the FM screen is severe, it is difficult to use the FM screen.

SUMMARY OF THE INVENTION

An object of the present invention is to provide a photosensitive lithographic printing plate, which is suitable for the high definition AM screen printing or FM screen printing, particularly, which is free from the unevenness of halftone dot with the FM screen.

As a result of intensive investigations, the inventors have found that the above-described object can be achieved by the constitution described below.

Specifically, the present invention includes the following.

(1) A photosensitive lithographic printing plate comprises a hydrophilic support having a photopolymerizable photosensitive layer containing the following components (i) to (v):

(i) a sensitizing dye having an absorption maximum in a wavelength range of 360 to 450 nm;

(ii) a hexaarylbisimidazole compound;

(iii) an addition polymerizable compound having an ethylenically unsaturated double bond;

(iv) a binder polymer; and (v) a mercapto compound represented by the following formula (1):

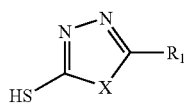

(1)

In formula (1), $R_1$ represents a hydrogen atom, a straight chain or branched alkyl group having from 1 to 18 carbon atoms, an alkyl group containing an alicyclic structure and having from 5 to 20 carbon atoms or a group containing an aromatic ring and having from 6 to 20 carbon atoms; X represents an oxygen atom, a sulfur atom or —N($R_2$)—; and $R_2$ represents a straight chain or branched alkyl group having from 1 to 18 carbon atoms, an alkyl group containing an alicyclic structure and having from 5 to 20 carbon atoms or a group containing an aromatic ring and having from 6 to 20 carbon atoms.

(2) The photosensitive lithographic printing plate as described in (1) described above, wherein the binder polymer comprises three structure units represented by the following formulae (B1) to (B3):

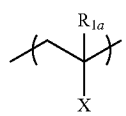

(B1)

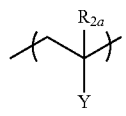

(B2)

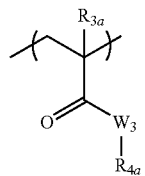

(B3)

In formulae (B1) to (B3), $R_{a1}$, $R_{a2}$ and $R_{a3}$ each independently represents a hydrogen atom or an alkyl group having from 1 to 6 carbon atom.

In formula (B1), X represents a functional group selected from —COOH, —CO—$W_1$-$L_1$-COOH and —$SO_3$H, $W_1$ represents an oxygen atom, a sulfur atom or —NH—, and $L_1$ represents a divalent organic group.

In formula (B2), Y represents —CO—O—$CH_2$—CH=$CH_2$ or —CO—$W_2$-$L_2$-O—CO—C($R_0$)=$CH_2$; $W_2$ represents an oxygen atom, a sulfur atom or —NH—, $L_2$ represents a divalent organic group, and $R_0$ represents a hydrogen atom or an alkyl group having from 1 to 6 carbon atom.

In formula (B3), $W_3$ represents an oxygen atom, a sulfur atom or —NH—, and $R_{4a}$ represents a straight chain or branched alkyl group having from 1 to 18 carbon atoms, an alkyl group containing an alicyclic structure and having from 5 to 20 carbon atoms or a group containing an aromatic ring and having from 6 to 20 carbon atoms.

(3) The photosensitive lithographic printing plate as described in (1) or (2) described above, wherein a mixing ratio of (iii) the addition polymerizable compound having an ethylenically unsaturated double bond and (iv) the binder polymer is a ratio of the addition polymerizable compound having an ethylenically unsaturated double bond (g)/the binder polymer (g)≦1.0.

According to the present invention, a negative-working photosensitive lithographic printing plate can be provided, which is suitable for conducting drawing with a laser beam, which is suitable for high definition AM screen printing or FM screen printing of screen line number of 200 or more, particularly providing uniform halftone dots in the halftone area in the case of using the FM screen, and which is excellent in safe light stability.

DETAILED DESCRIPTION OF THE INVENTION

[Photosensitive Lithographic Printing Plate]

With respect to the photosensitive lithographic printing plate (lithographic printing plate precursor), which has a spectral sensitivity in a wavelength range of 360 to 450 nm, according to the present invention, the constitutions thereof will be described in order below.

[Photopolymerizable Photosensitive Layer]

The photosensitive lithographic printing plate of the invention has a photopolymerizable photosensitive layer having a spectral sensitivity at least in a wavelength range of 360 to 450 nm and containing the following components (i) to (v):

(i) a sensitizing dye having an absorption maximum in a wavelength range of 360 to 450 nm;
(ii) a hexaarylbisimidazole compound;
(iii) an addition polymerizable compound having an ethylenically unsaturated double bond;
(iv) a binder polymer; and
(v) a mercapto compound represented by the following formula (1):

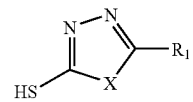

(1)

In formula (1), $R_1$ represents a hydrogen atom, a straight chain or branched alkyl group having from 1 to 18 carbon atoms, an alkyl group containing an alicyclic structure and having from 5 to 20 carbon atoms or a group containing an aromatic ring and having from 6 to 20 carbon atoms; X represents an oxygen atom, a sulfur atom or —N($R_2$)—; and $R_2$ represents a straight chain or branched alkyl group having from 1 to 18 carbon atoms, an alkyl group containing an alicyclic structure and having from 5 to 20 carbon atoms or a group containing an aromatic ring and having from 6 to 20 carbon atoms.

[Sensitizing Dye]

The sensitizing dye used in the photopolymerization type photosensitive lithographic printing plate according to the invention is a sensitizing dye having an absorption maximum in a wavelength range of 360 to 450 nm. Such sensitizing dyes include, for example, merocyanine dyes represented by formula (2) shown below, benzopyranes (coumarins) represented by formula (3) shown below, aromatic ketones represented by formula (4) shown below, and anthracenes represented by formula (5) shown below.

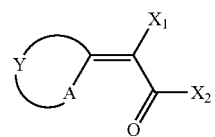

(2)

In formula (2), A represents —S— or —N($R_6$)—, $R_6$ represents a monovalent non-metallic atomic group, Y represents a non-metallic atomic group necessary for forming a basic nucleus of the dye together with the adjacent A and the adjacent carbon atom, and $X_1$ and $X_2$ each independently represents a monovalent non-metallic atomic group or $X_1$ and $X_2$ may be combined with each other to form an acidic nucleus of the dye.

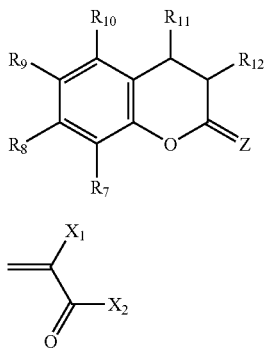

In formula (3), =Z represents an oxy group, a thioxy group, an imino group or an alkylydene group represented by the partial structural formula (a) described above, $X_1$ and $X_2$ have the same meanings as defined in formula (2), and $R_7$ to $R_{12}$ each independently represents a monovalent non-metallic atomic group.

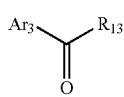

In formula (4), $Ar_3$ represents an aromatic group which may have a substituent or a heteroaromatic group which may have a substituent, and $R_{13}$ represents a monovalent non-metallic atomic group. More preferably, $R_{13}$ represents an aromatic group or a heteroaromatic group or $Ar_3$ and $R_{13}$ may be combined with each other to form a ring.

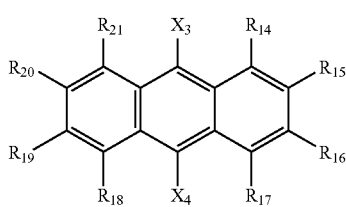

In formula (5), $X_3$, $X_4$ and $R_{14}$ to $R_{21}$ each independently represents a monovalent non-metallic atomic group. More preferably, $X_3$ and $X_4$ each independently represents an electron-donating group having a negative Hammett substituent constant.

In formulae (2) to (5), preferred examples of the monovalent non-metallic atomic group represented by any one of $X_1$ to $X_4$ and $R_6$ to $R_{21}$ include a hydrogen atom, an alkyl group (for example, a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group or a 3-butynyl group), an aryl group (for example, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonatophenyl group, a phosphonophenyl group or a phosphonatophenyl group), a heteroaryl group (for example, thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrene, acridine, perimidine, phenanthroline, phthalazine, phenarsazine, phenoxazine, furazane or phenoxazine), an alkenyl group (for example, a vinyl group, a 1-propenyl group, a 1-butenyl group, a cinnamyl group or a 2-chloro-1-ethenyl group), an alkynyl group (for example, an ethynyl group, a 1-propynyl group, a 1-butynyl group or a trimethylsilylethynyl group), a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxy group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and its conjugated base group (hereinafter referred to as a "phosphonato group"), a dialkylphosphono group (—$PO_3(alkyl)_2$), a diarylphosphono group (—$PO_3(aryl)_2$), an alkylarylphosphono group (—$PO_3(alkyl)(aryl)$), a monoalkylphosphono group (—$PO_3H(alkyl)$) and its conjugated base group (hereinafter referred to as an "alkylphosphonato group"), a monoarylphosphono group (—$PO_3H(aryl)$) and its conjugated base group (hereinafter referred to as an "arylphosphonato group"), a phosphonooxy group (—$OPO_3H_2$) and its conjugated base group (hereinafter referred to as a "phosphonatooxy group"), a dialkylphosphonooxy group (—$OPO_3(alkyl)_2$), a diarylphosphonooxy group (—$OPO_3(aryl)_2$), an alkylarylphosphonooxy group (—$OPO_3(alkyl)(aryl)$), a monoalkylphosphonooxy group (—$OPO_3H(alkyl)$) and its conjugated base group (hereinafter referred to as an "alkylphosphonatooxy group"), a monoarylphosphonooxy group (—$OPO_3H(aryl)$) and its conjugated base group (hereinafter referred to as an "arylphosphonatooxy group"), a cyano group, and a nitro group. Of the substituents, a hydrogen atom, an alkyl group, an aryl group, a halogen atom, an alkoxy group and an acyl group are particularly preferred.

The basic nucleus of the dye formed by Y together with the adjacent A and the adjacent carbon atom in formula (2) includes, for example, a 5-membered, 6-membered or 7-membered, nitrogen-containing or sulfur-containing heterocyclic ring, and it is preferably a 5-membered or 6-membered heterocyclic ring.

As the nitrogen-containing heterocyclic ring, those which are known to constitute basic nuclei in merocyanine dyes described in L. G. Brooker et al., *J. Am. Chem. Soc.*, Vol. 73, pages 5326 to 5358 (1951) and references cited therein can be preferably used. Specific examples thereof include thiazoles (for example, thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenylthiazole) or 4-(2-thienyl)thiazole); benzothiazoles (for example, benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole or 5-ethoxycarbonylbenzothiazole); naphthothiazoles (for example, naphtho[1,2]thiazole, naphtho[2,1]thiazole, 5-methoxynaphtho[2,1]thiazole, 5-ethoxynaphtho[2,1]thiazole, 8-methoxynaphtho[1,2]thiazole or 7-methoxynaphtho[1,2]thiazole); thianaphtheno-7',6',4,5-thiazoles (for example, 4'-methoxythianaphtheno-7',6',4,5-thiazole); oxazoles (for example, 4-methyloxazole, 5-methyloxazole, 4-phenyloxazole, 4,5-diphenyloxazole, 4-ethyloxazole, 4,5-dimethyloxazole or 5-phenyloxazole); benzoxazoles (for example, benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole or 6-hydroxybenzoxazole); naphthoxazoles (for example, naphth[1,2]oxazole or naphth[2,1]oxazole); selenazoles (for example, 4-methylselenazole or 4-phenylselenazole); benzoselenazoles (for example, benzoselenazole, 5-chlorobenzoselenazole, 5-methoxybenzoselenazole, 5-hydroxybenzoselenazole or tetrahydrobenzoselenazole); naphthoselenazoles (for example, naphtho[1,2]selenazole or naphtho[2,1]selenazole); thiazolines (for example, thiazoline or 4-methylthiazoline); 2-quinolines (for example, quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline or 8-hydroxyquinoline); 4-quinolines (for example, quinoline, 6-methoxyquinoline, 7-methylquinoline or 8-methylquinoline); 1-isoquinolines (for example, isoquinoline or 3,4-dihydroisoquinoline); 3-isoquinolines (for example, isoquinoline); benzimidazoles (for example, 1,3-diethylbenzimidazole or 1-ethyl-3-phenylbenzimidazole); 3,3-dialkylindolenines (for example, 3,3-dimethylindolenine, 3,3,5-trimethylindolenine or 3,3,7-trimethylindolenine); 2-pyridines (for example, pyridine or 5-methylpyridine); and 4-pyridines (for example, pyridine).

Examples of the sulfur-containing heterocyclic ring include dithiol partial structures in dyes described in JP-A-3-296759.

Specific examples thereof include benzodithiols (for example, benzodithiol, 5-tert-butylbenzodithiol or 5-methylbenzodithiol); naphthodithiols (for example, naphtho[1,2]dithiol or naphtho[2,1]dithiol); and dithiols (for example, 4,5-dimethyldithiol, 4-phenyldithiol, 4-methoxycarbonyldithiol, 4,5-dimethoxycarbonyldithiol, 4,5-ditrifluoromethyldithiol, 4,5-dicyanodithiol, 4-methoxycarbonylmethyldithiol or 4-carboxymethyldithiol).

In the description with respect to the heterocyclic ring above, for convenience and by convention, the names of heterocyclic mother skeletons are used. In the case of constituting the basic nucleus partial structure in the sensitizing dye, the heterocyclic ring is introduced in the form of a substituent of alkylydene type where a degree of unsaturation is decreased one step. For example, a benzothiazole skeleton is introduced as a 3-substituted-2(3H)-benzothiazolilydene group.

Of the sensitizing dyes having an absorption maximum in a wavelength range of 360 to 450 nm, dyes represented by formula (6) shown below are more preferred in view of high sensitivity.

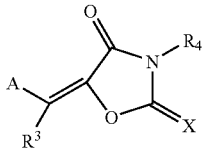

(6)

In formula (6), A represents an aromatic ring which may have a substituent or a hetero ring which may have a substituent, X represents =O, =S or =N—$R_5$, $R_3$, $R_4$ and $R_5$ each independently represents a hydrogen atom or a monovalent non-metallic atomic group, or A and $R_3$ or $R_4$ and $R_5$ may be combined with each other to form an aliphatic or aromatic ring.

The formula (6) will be described in more detail below. $R_3$, $R_4$ and $R_5$ each independently represents a hydrogen atom or a monovalent non-metallic atomic group, preferably a substituted or unsubstituted alkyl group, a substituted or unsubstituted alkenyl group, a substituted or unsubstituted aryl group, a substituted or unsubstituted aromatic heterocyclic residue, a substituted or unsubstituted alkoxy group, a substituted or unsubstituted alkylthio group, a hydroxy group or a halogen atom.

Preferred examples of $R_3$, $R_4$ and $R_5$ will be specifically described below. Preferred examples of the alkyl group include a straight chain, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among them, a straight chain alkyl group having from 1 to 12 carbon atoms, a branched alkyl group having from 3 to 12 carbon atoms and a cyclic alkyl group having from 5 to 10 carbon atoms are more preferable.

As the substituent for the substituted alkyl group, a monovalent non-metallic atomic group exclusive of a hydrogen atom is used. Preferred examples thereof include a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and its conjugated base group (hereinafter referred to as a "phosphonato group"), a dialkylphosphono group (—$PO_3(alkyl)_2$), a diarylphosphono group (—$PO_3(aryl)_2$), an alkylarylphosphono group (—$PO_3(alkyl)(aryl)$), a monoalkylphosphono group (—$PO_3H(alkyl)$) and its conjugated base group (hereinafter referred to as an "alkylphosphonato group"), a monoarylphosphono group (—$PO_3H(aryl)$) and its conjugated base group (hereinafter referred to as an "arylphosphonato group"), a phosphonooxy group (—$OPO_3H_2$) and its conjugated base group (hereinafter referred to as a "phosphonatooxy group"), a dialkylphosphonooxy group (—$OPO_3(alkyl)_2$), a diarylphosphonooxy group (—$OPO_3(aryl)_2$), an alkylarylphosphonooxy group (—$OPO_3(alkyl)(aryl)$), a monoalkylphosphonooxy group (—$OPO_3H(alkyl)$) and its conjugated base group (hereinafter referred to as an "alkylphosphonatooxy group"), a monoarylphosphonooxy group (—$OPO_3H(aryl)$) and its conjugated base group (hereinafter referred to as an "arylphosphonatooxy group"), a cyano group, a nitro group, an aryl group, a heteroaryl group, an alkenyl group and an alkynyl group.

In the substituents, specific examples of the alkyl group include those described for the alkyl group above. Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonatophenyl group, a phosphonophenyl group and a phosphonatophenyl group.

Preferred examples of the aromatic heterocyclic residue represented by any one of $R_3$, $R_4$ and $R_5$ include a monocyclic or polycyclic aromatic ring containing at least one of a nitrogen atom, an oxygen atom and a sulfur atom. Examples of especially preferred aromatic heterocyclic residue include thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrene, acridine, perimidine, phenanthroline, phthalazine, phenarsazine, phenoxazine, furazane and phenoxazine. These groups may be benzo-fused or may have a substituent.

Also, preferred examples of the alkenyl group represented by any one of $R_3$, $R_4$ and $R_5$ include a vinyl group, a 1-propenyl group, a 1-butenyl group, a cinnamyl group and a 2-chloro-1-ethenyl group. Examples of the alkynyl group include an ethynyl group, a 1-propynyl group, a 1-butynyl group and a trimethylsilylethynyl group. Examples of $G_1$ in the acyl group ($G_1CO$—) include a hydrogen atom and the above-described alkyl group and aryl group. Of the substituents, a halogen atom (for example, —F, —Br, —Cl or —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxy group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphonato group, a diarylphosphono group, a monoalkylphosphono group, an alkylphosphonato group, a monoarylphosphono group, an arylphosphonato group, a phosphonooxy group, a phosphonatooxy group, an aryl group and an alkenyl group are more preferable.

On the other hand, as an alkylene group in the substituted alkyl group, a divalent organic residue resulting from elimination of any one of hydrogen atoms on the above-described alkyl group having from 1 to 20 carbon atoms can be enumerated. Examples of preferred alkylene group include a straight chain alkylene group having from 1 to 12 carbon atoms, a branched alkylene group having from 3 to 12 carbon atoms and a cyclic alkylene group having from 5 to 10 carbon atoms.

Specific examples of the preferred substituted alkyl group represented by any one of $R_3$, $R_4$ and $R_5$, which is obtained by combining the above-described substituent with an alkylene group, include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl) carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

Preferred examples of the aryl group represented by any one of $R_3$, $R_4$ and $R_5$ include a fused ring formed from one to three benzene rings and a fused ring formed from a benzene ring and a 5-membered unsaturated ring. Specific examples thereof include a phenyl group, a naphthyl group, an anthryl group, a phenanthryl group, an indenyl group, an acenaphthenyl group and a fluorenyl group. Among them, a phenyl group and a naphthyl group are more preferable.

Specific examples of the preferred substituted aryl group represented by any one of $R_3$, $R_4$ and $R_5$ include aryl groups having a monovalent non-metallic atomic group exclusive of a hydrogen atom as a substituent on the ring-forming carbon atom of the above-described aryl group. Preferred examples of the substituent include the above-described alkyl groups and substituted alkyl groups, and the substituents described for the above-described substituted alkyl group. Specific examples of the preferred substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl) carbamoylphenyl group, a sulfophenyl group, a sulfonatophenyl group, a sulfamoylphenyl group, an N-ethylsulfamoylphenyl group, an N,N-dipropyl sulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, a 2-butenyl group, a 2-methylallylphenyl group, a 2-methylpropenylphenyl group, a 2-propenylphenyl group, a 2-butynylphenyl group and a 3-butynylphenyl group.

Next, A in formula (6) will be described below. A represents an aromatic ring which may have a substituent or hetero ring which may have a substituent. Specific examples of the aromatic ring which may have a substituent and hetero ring which may have a substituent include those described for any one of R₃, R₄ and R₅ in formula (6).

The sensitizing dye represented by formula (6) according to the invention is obtained by a condensation reaction of the acidic nucleus above-described or an active methyl group-containing the acidic nucleus with the substituted or unsubstituted, aromatic ring or hetero ring and can be synthesized with reference to JP-B-59-28329 (the term "JP-B" as used herein means an "examined Japanese patent publication").

Preferred specific examples (D1) to (D41) of the compound represented by formula (6) are set forth below. Also, when isomers with respect to a double bond connecting an acidic nucleus and a basic nucleus are present, the invention should not be construed as being limited only to any one of the isomers.

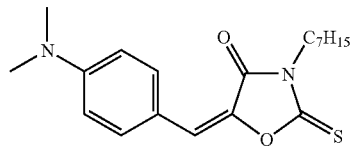
(D1)

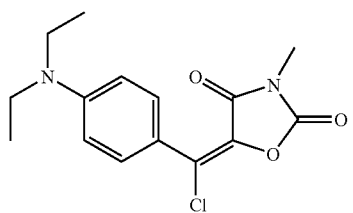
(D2)

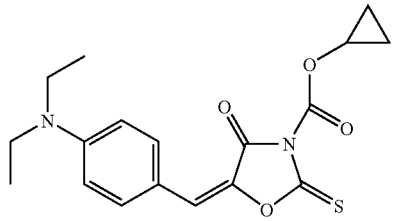
(D3)

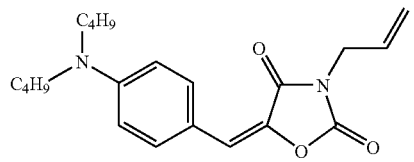
(D4)

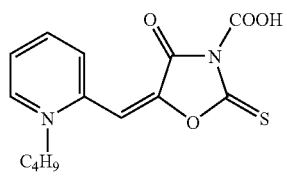
(D5)

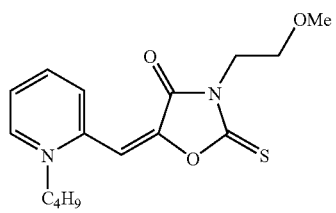
(D6)

-continued

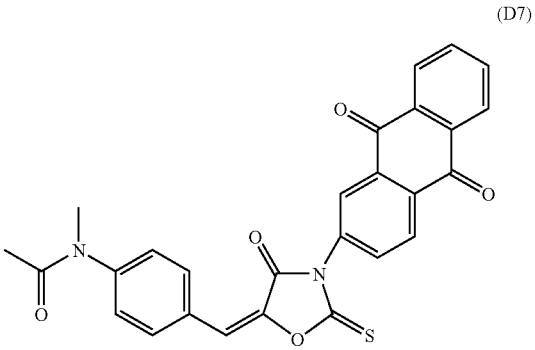
(D7)

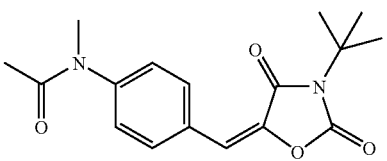
(D8)

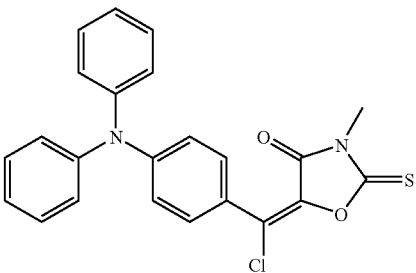
(D9)

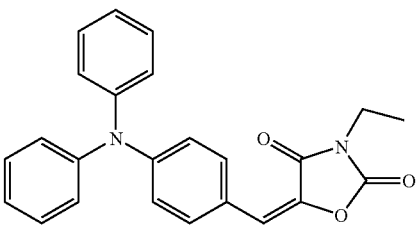
(D10)

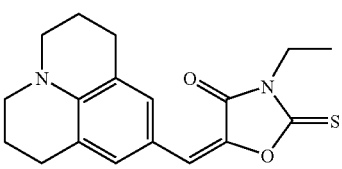
(D11)

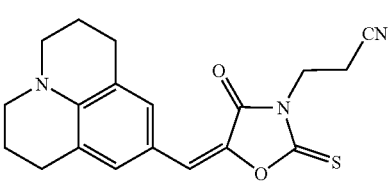
(D12)

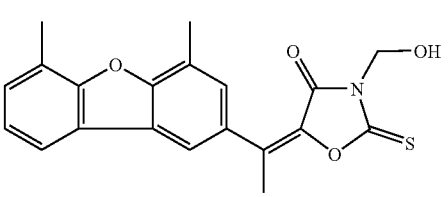
(D13)

-continued
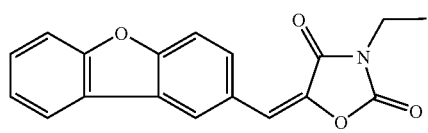
(D14)
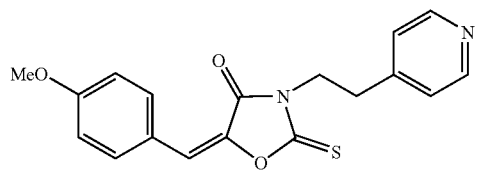
(D15)
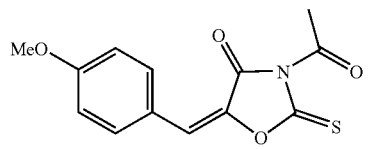
(D16)
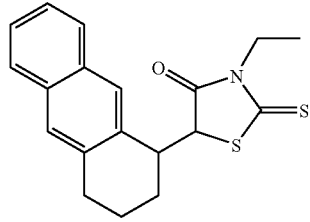
(D17)
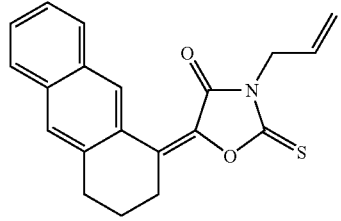
(D18)
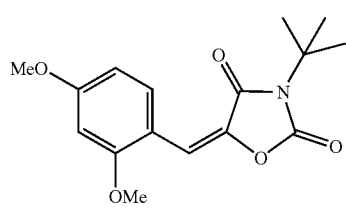
(D19)
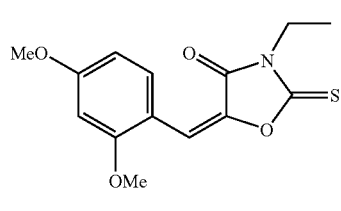
(D20)
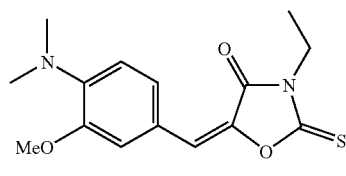
(D21)
-continued
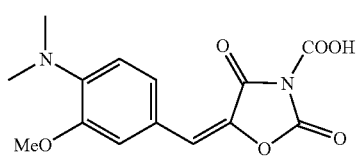
(D22)
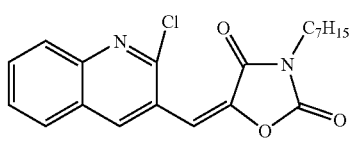
(D23)
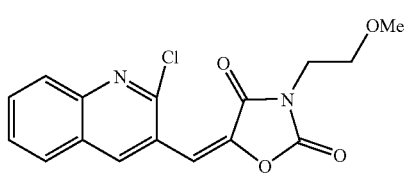
(D24)
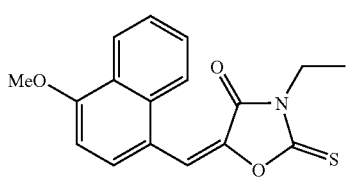
(D25)
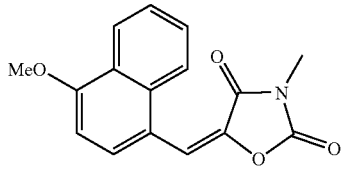
(D26)
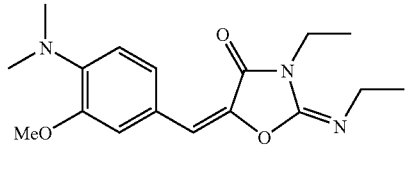
(D27)
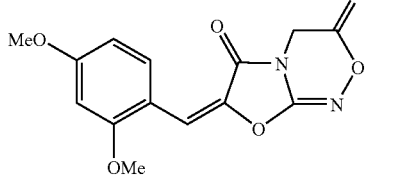
(D28)
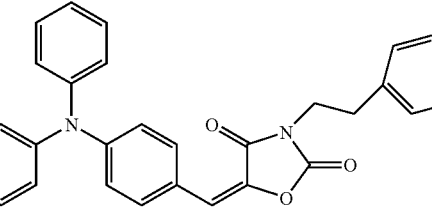
(D29)

-continued
(D30)
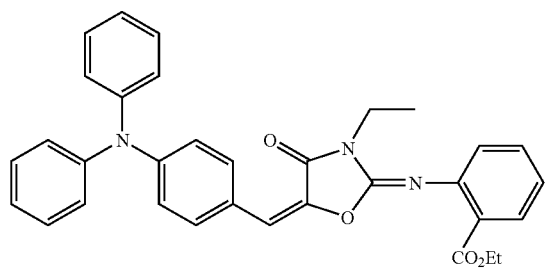
(D31)
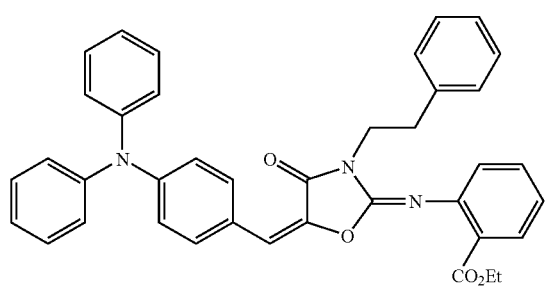
(D32)
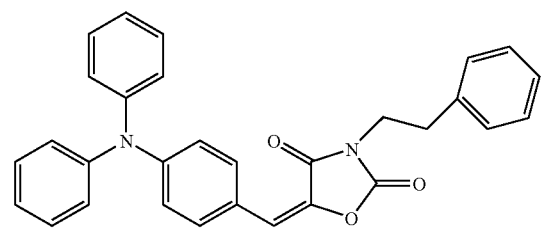
(D33)
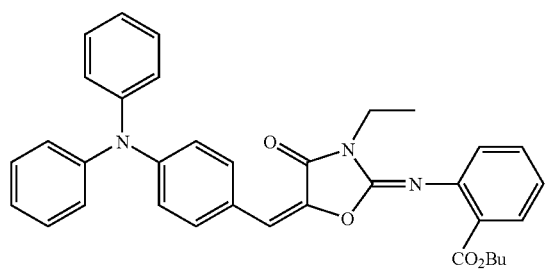
(D34)
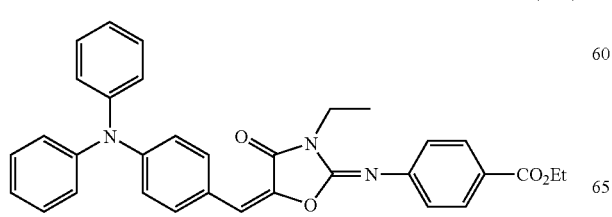
-continued
(D35)
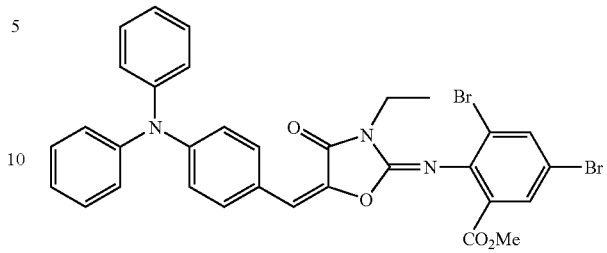
(D36)
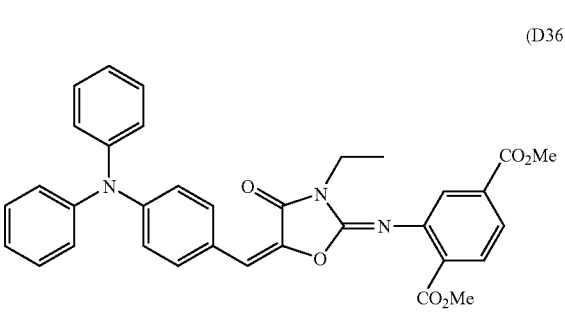
(D37)
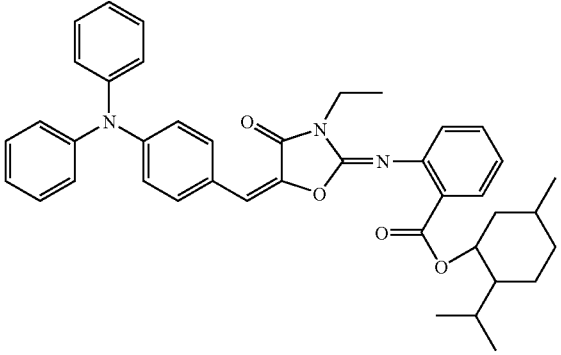
(D38)
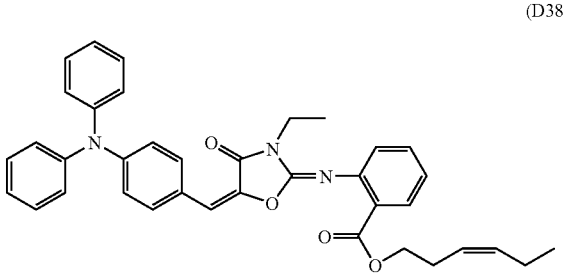
(D39)
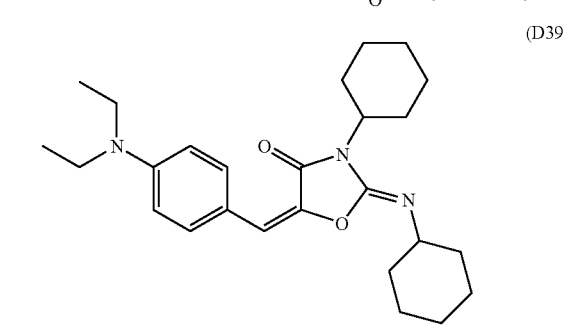

-continued

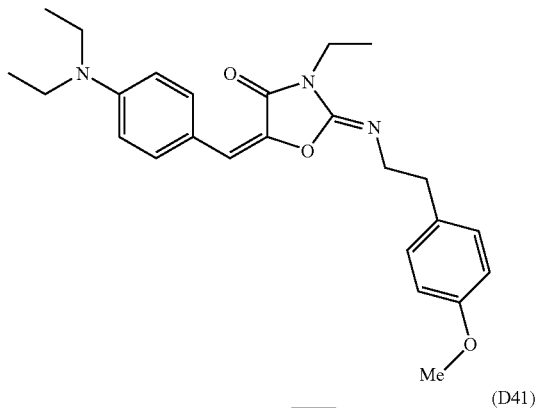

(D40)

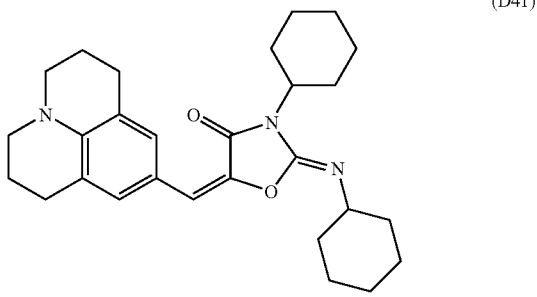

(D41)

The amount of the sensitizing dye used is preferably from 1.0 to 10.0% by weight, more preferably from 1.0 to 5.0% by weight, based on the total components of the photosensitive layer.

[Hexaarylbisimidazole Compound (Photopolymerization Initiator)]

The hexaarylbisimidazole compound (HABI, a dimer of triarylimidazole) is used as a polymerization initiator added to the photosensitive layer. Synthesis process of the HABI is described in German Patent 1,470,154 and the use thereof in photopolymerizable compositions is described in European Patents 24,629 and 107,792, U.S. Pat. No. 4,410,621, European Patent 215,453 and German Patent 3,211,312.

Examples of the hexaarylbisimidazole compound for use in the invention include 2,4,5,2',4',5'-hexaphenylbisimidazole, 2,2'-bis(2-chlorophenyl)-4,5,4',5'-tetraphenylbisimidazole, 2,2'-bis(2-bromophenyl)-4,5,4',5'-tetraphenylbisimidazole, 2,2'-bis(2,4-dichlorophenyl)-4,4',5,5'-tetraphenylbisimidazole, 2,2'-bis(2-chlorophenyl)-4,5,4',5'-tetrakis(3-methoxyphenyl)bisimidazole, 2,2'-bis(2-chlorophenyl)-4,5,4',5'-tetrakis(3,4,5-trimethoxyphenyl) bisimidazole, 2,5,2',5'-tetrakis(2-chlorophenyl)-4,4'-bis(3,4-dimethoxyphenyl) bisimidazole, 2,2'-bis(2,6-dichlorophenyl)-4,5, 4',5'-tetraphenylbisimidazole, 2,2'-bis (2-nitrophenyl)-4,5, 4',5'-tetraphenylbisimidazole, 2,2'-di-o-tolyl-4,5,4',5'-tetraphenylbisimidazole, 2,2'-bis(2-ethoxyphenyl)-4,5,4',5'-tetraphenylbisimidazole and 2,2'-bis (2,6-difluorophenyl)-4,5, 4',5'-tetraphenylbisimidazole.

The amount of the hexaarylbisimidazole compound is ordinarily from 0.01 to 30% by weight, preferably from 0.5 to 20% by weight, based on the total components constituting the photosensitive layer.

[Addition Polymerizable Compound Having Ethylenically Unsaturated Double Bond]

The addition polymerizable compound having an ethylenically unsaturated double bond included in the photosensitive layer used in the invention can be appropriately selected from compounds having at least one, preferably two or more ethylenically unsaturated double bond groups.

The compound has a chemical form, for example, a monomer, a prepolymer (i.e., dimmer, trimer or oligomer), a copolymer thereof or a mixture thereof.

Examples of the monomer and copolymer include esters between an unsaturated carboxylic acid (for example, acrylic acid, methacrylic acid, itaconic acid, crotonic acid, isocrotonic acid or maleic acid) and an aliphatic polyhydric alcohol compound and amides between an unsaturated carboxylic acid and an aliphatic polyamine compound.

Specific examples of the monomer of the ester between an aliphatic polyhydric alcohol compound and an unsaturated carboxylic acid include:

acrylates, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate or polyester acrylate oligomer;

methacrylates, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl]dimethylmethane or bis-[p-(methacryloxyethoxy)phenyl]dimethylmethane; itaconates, for example, ethylene glydcol diitaconate, propylene glycol diitaconate, 1,3-butanediol diitaconate, 1,4-butanediol diitaconate, tetramethylene glycol diitaconate, pentaerythritol diitaconate or sorbitol tetraitaconate; crotonatates, for example, ethylene glycol dicrotonate, tetramethylene glycol dicrotonate, pentaerythritol dicrotonate or sorbitol tetradicrotonate;

isocrotonates, for example, ethylene glycol diisocrotonate, pentaerythritol diisocrotonate or sorbitol tetraisocrotonate; and maleates, for example, ethylene glycol dimaleate, triethylene glycol dimaleate, pentaerythritol dimaleate or sorbitol tetramaleate.

Further, mixtures of the ester monomers are exemplified.

Also, specific examples of the monomer of the amide between an aliphatic polyamine compound and an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide.

Also, urethane acrylates described in JP-A-51-37193, polyester acrylates described in JP-A-48-64183, JP-B-49-43191 and JP-B-52-30490, and polyfunctional acrylates or methacrylates, for example, epoxyacrylates obtained by reacting an epoxy resin with (meth)acrylic acid are exemplified. Further, photo-curable monomers and oligomers described in *Nippon Secchaku Kyokaishi*, Vol. 20, No. 7, pages 300 to 308 (1984) can be used.

Specifically, NK OLIGO U-4HA, NK OLIGO U-4H, NK OLIGO U-6HA, NK OLIGO U-108A, NK OLIGO U-1084A, NK OLIGO U-200AX, NK OLIGO U-122A, NK OLIGO U-340A, NK OLIGO UA-324A and NK OLIGO UA-100 (all of which are manufactured by Shin-Nakamura Chemical Co., Ltd.); UA-306H, AI-600, UA-101T, UA-101I, UA-306T and UA-306I (all of which are manufactured by Kyoeisha Chemical Co., Ltd.); and ART RESIN UN-9200A, ART RESIN UN-3320HA, ART RESIN UN-3320HB, ART RESIN UN-3320HC, ART RESIN SH-380G, ART RESIN SH-500 and ART RESIN SH-9832 (all of which are manufactured by Negami Chemical Industrial Co., Ltd.) are exemplified.

The amount of the addition polymerizable compound having an ethylenically unsaturated double bond added is preferably from 5 to 90% by weight, more preferably from 10 to 80% by weight, based on the total components of the photosensitive layer.

[Binder Polymer]

The binder polymer is included in the photosensitive layer according to the invention.

Since the binder polymer not only functions as a film-forming agent of the photosensitive layer but also is required to be dissolved in an alkali developer, an organic polymer soluble or swellable in alkali water is used as the binder polymer. Specifically, the binder polymer can be removed with alkali development and, if desired, on applying pressure by a brush, because it is the organic polymer soluble or swellable in alkali water.

The binder polymer preferably used in the invention contains at least three structure units represented by the following formulae (B1) to (B3):

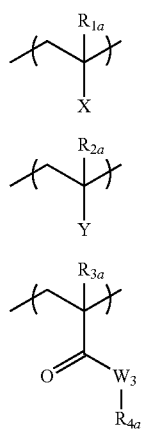

In formulae (B1) to (B3), $R_{a1}$, $R_{a2}$ and $R_{a3}$ each independently represents a hydrogen atom or an alkyl group having from 1 to 6 carbon atoms.

In formula (B1), X represents a functional group selected from —COOH, —CO—$W_1$-$L_1$-COOH or —$SO_3H$, $W_1$ represents an oxygen atom, a sulfur atom or —NH—, and $L_1$ represents a divalent organic group.

In formula (B2), Y represents —CO—O—$CH_2$—CH=$CH_2$ or —CO—$W_2$-$L_2$-O—CO—C(Ro)=$CH_2$. $W_2$ represents an oxygen atom, a sulfur atom or —NH—, $L_2$ represents a divalent organic group, and $R_0$ represents a hydrogen atom or an alkyl group having from 1 to 6 carbon atom.

In formula (B3), $W_3$ represents an oxygen atom, a sulfur atom or —NH—, and $R_{4a}$ represents a straight chain or branched alkyl group having from 1 to 18 carbon atoms, an alkyl group containing an alicyclic structure and having from 5 to 20 carbon atoms or a group containing an aromatic ring and having from 6 to 20 carbon atoms.

Specific examples of the structure units represented by formulae (B1) to (B3) are set forth below, but the invention should not be construed as being limited thereto.

Specific examples of the structure unit represented by formula (B1) include those having the structure shown below.

1-1

1-2

1-3

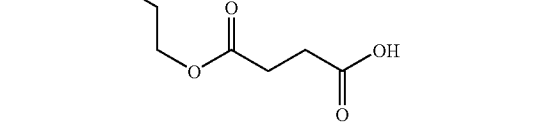

1-4

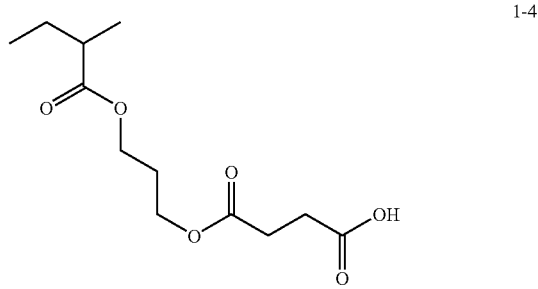

1-5

1-6 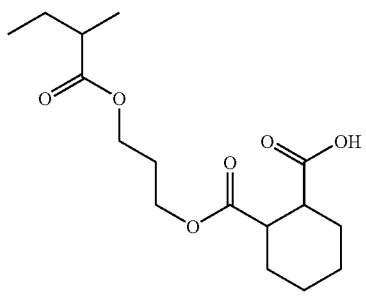
1-7 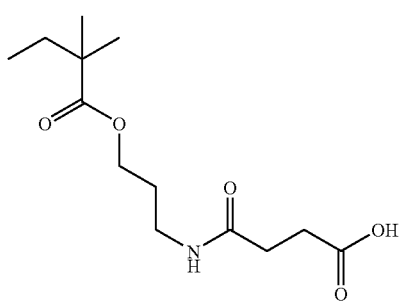
1-8 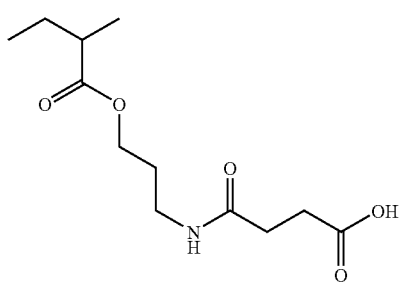
1-9 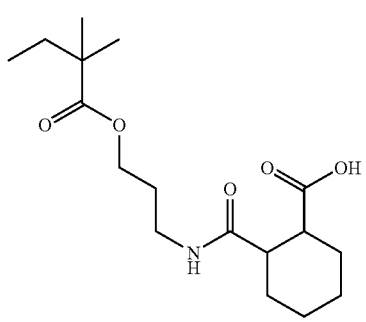
1-10 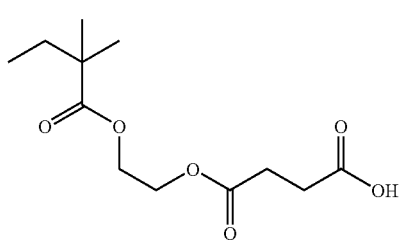
1-11 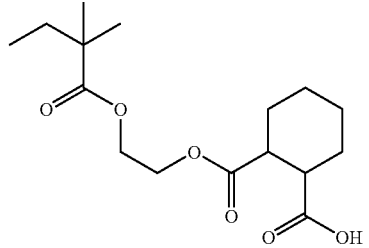
1-12 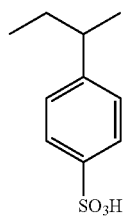
1-13 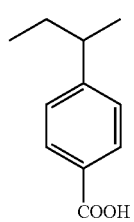
Specific examples of the structure unit represented by formula (B2) include those having the structure shown below.
2-1 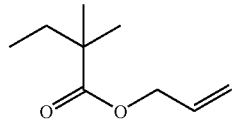
2-2 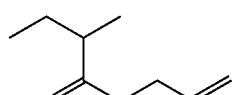
2-3 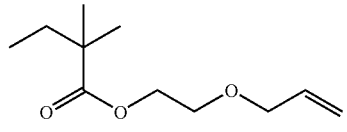
2-4 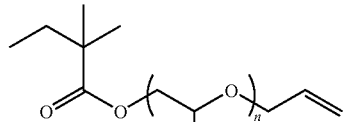
2-5 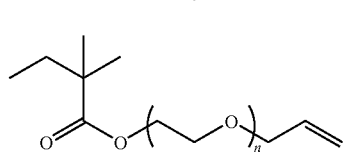

-continued

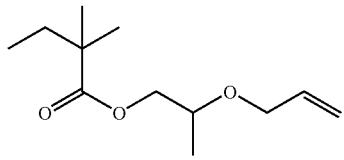
2-6

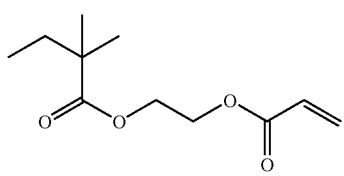
2-7

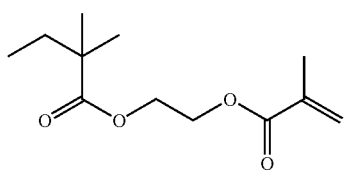
2-8

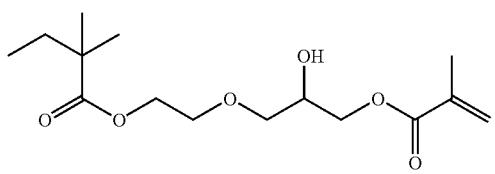
2-9

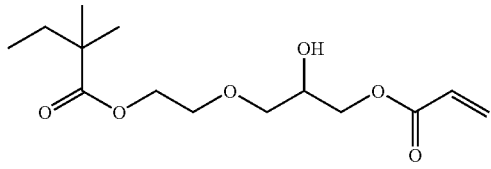
2-10

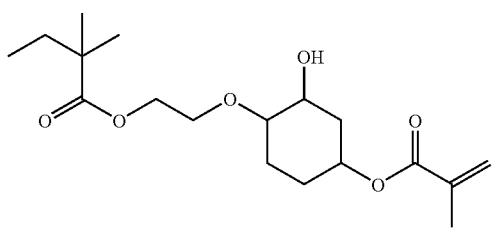
2-11

Specific examples of the structure unit represented by formula (B2) include those corresponding to alkyl or aryl (meth)acrylates, for example, methyl (meth)acrylate, ethyl (meth)acrylate, isobutyl (meth)acrylate, n-butyl (meth)acrylate, isopropyl (meth)acrylate, cyclohexyl (meth)acrylate, n-hexyl (meth)acrylate, adamantyl (meth)acrylate, benzyl (meth)acrylate or phenethyl (meth)acrylate, and (meth)acrylates represented by formulae shown below.

In the formulae, R preferably represents a methyl group, an ethyl group, an isopropyl group, a n-butyl group, a tert-butyl group, a cyclohexyl group, a phenethyl group, a benzyl group or a n-hexyl group.

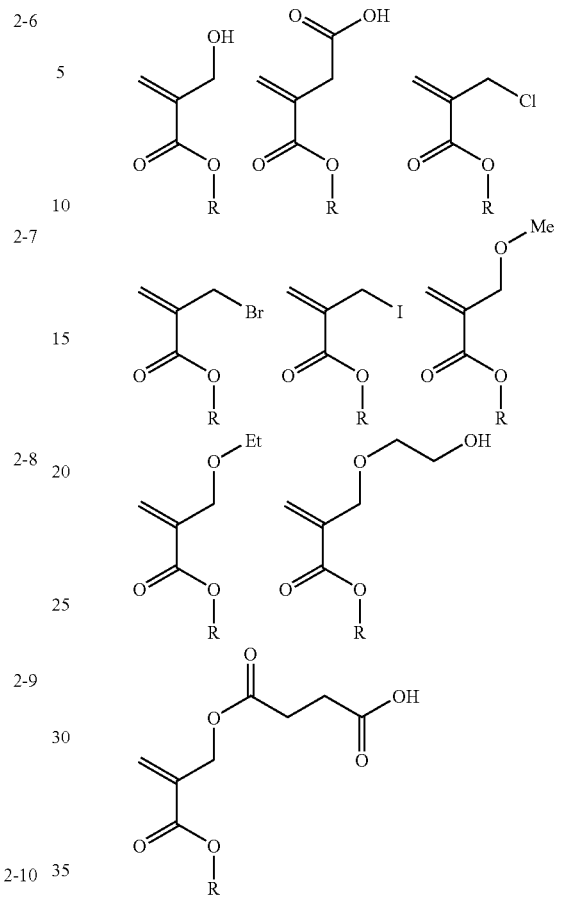

In order to ensure developing property of the photopolymerizable photosensitive layer, it is preferred that the binder polymer used has adequate molecular weight and acid value. Polymers having a weight average molecular weight of 5,000 to 300,000 and an acid value of 0.5 to 200 are especially preferable. The term "acid value" as used herein mans a mg number of potassium hydroxide necessary for neutralizing free fatty acid contained in one g of a sample. The acid value is preferably from 5.0 to 180 and more preferably from 10 to 150.

A ratio of the total amount of the structure unit represented by formula (B1) and the structure unit represented by formula (B3) to the amount of the structure unit having an ethylenically unsaturated double bond represented by formula (B2) is preferably from 0.1 to 3.0, more preferably from 0.1 to 2.0, most preferably from 0.1 to 1.0, in terms of a weight ratio.

Any mixing ratio of the structure units represented by formulae (B1), (B2) and (B3) may be used as long as the above-described molecular weight, acid value and amount of the double bond included are satisfied.

Further, as long as the above-described molecular weight, acid value and amount of the double bond included are satisfied, a structure unit other than the structure units represented by formulae (B1), (B2) and (B3) may also be used.

The binder polymer can be incorporated in an appropriate amount into the photosensitive layer. In view of the strength of image formed or the like, the amount is ordinarily 90% by weight or less, preferably from 10 to 90% by weight, and more preferably from 30 to 80% by weight.

In the invention, an organic polymer soluble or swellable in alkali water other than the polymer described above can be used or the polymer described above can be used together with other organic polymer as a mixture.

Other organic polymers soluble or swellable in alkali water include various kinds of polymers. When the photosensitive lithographic printing plate is desired to be developed with water, a water-soluble organic polymer is used. Examples of such an organic polymer include addition polymers having a carboxylic acid group in the side chain thereof, for example, polymers described in JP-A-59-44615, JP-B-54-34327, JP-B-58-12577, JP-B-54-25957, JP-A-54-92723, JP-A-59-53836 and JP-A-59-71048, more specifically, methacrylic acid copolymers, acrylic acid copolymers, itaconic acid copolymers, crotonic acid copolymers, maleic acid copolymers and partially esterified maleic acid copolymers, acidic cellulose derivatives having a carboxylic acid group in the side chain thereof, polymers obtained by adding a cyclic acid anhydride to an addition polymer having a hydroxy group, polyvinyl pyrrolidone, polyethylene oxide, and alcohol-soluble polyamides and polyethers of 2,2-bis-(4-hydroxyphenyl)propane with epichlorohydrin capable of increasing strength of a cured film.

Further, polyurethane resins as described in JP-B-7-120040, JP-B-7-120041, JP-B-7-120042, JP-B-8-12424, JP-A-63-287944, JP-A-63-287947, JP-A-1-271741 and JP-A-11-352691 are also useful in the invention.

[Mercapto Compound]

The mercapto compound represented by formula (1) shown below is used together with the hexaarylbisimidazole compound as a photopolymerization initiator system in the invention.

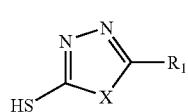

(1)

In formula (1), $R_1$ represents a hydrogen atom, a straight chain or branched alkyl group having from 1 to 18 carbon atoms, an alkyl group containing an alicyclic structure and having from 5 to 20 carbon atoms or a group containing an aromatic ring and having from 6 to 20 carbon atoms; X represents an oxygen atom, a sulfur atom or —N($R_2$)—; and $R_2$ represents a straight chain or branched alkyl group having from 1 to 18 carbon atoms, an alkyl group containing an alicyclic structure and having from 5 to 20 carbon atoms or a group containing an aromatic ring and having from 6 to 20 carbon atoms.

Preferred examples of the compound represented by formula (1) are set forth below.

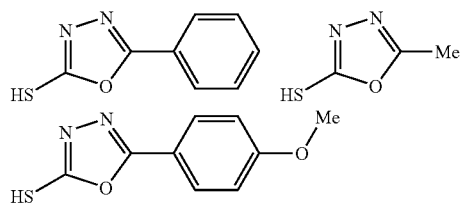

-continued

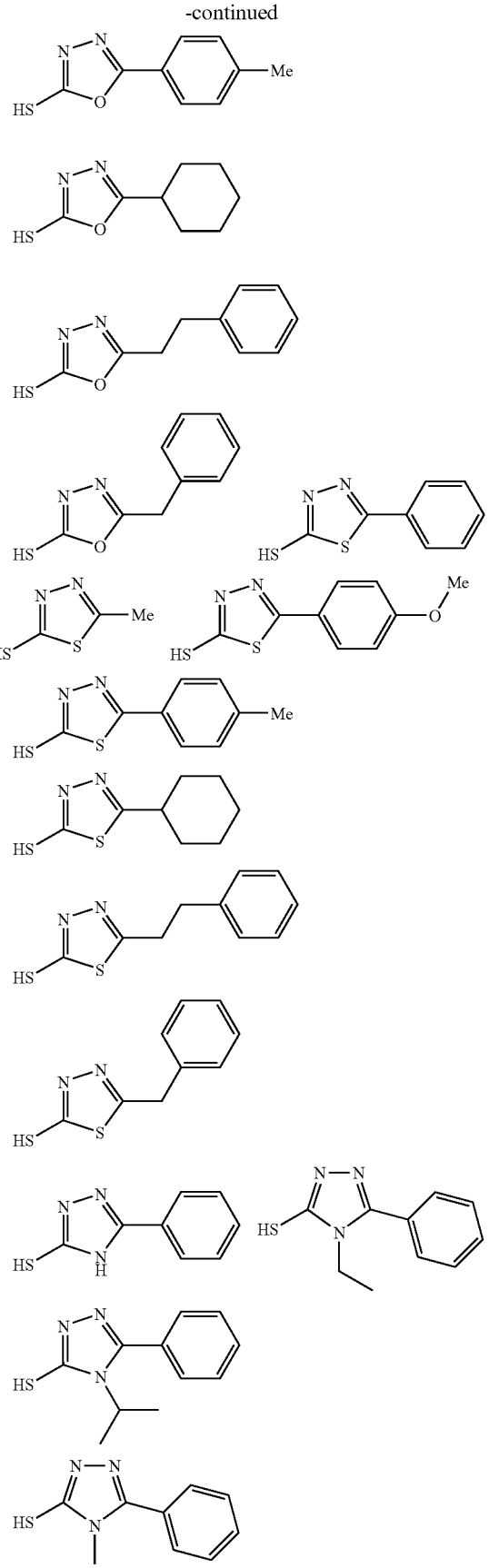

-continued

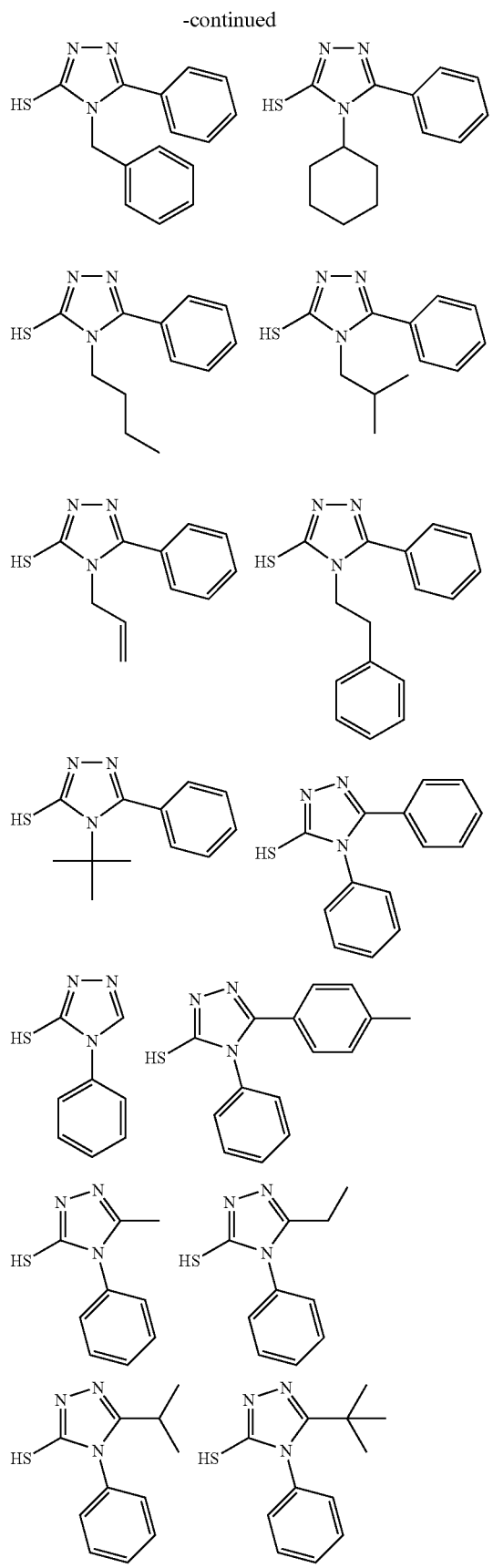
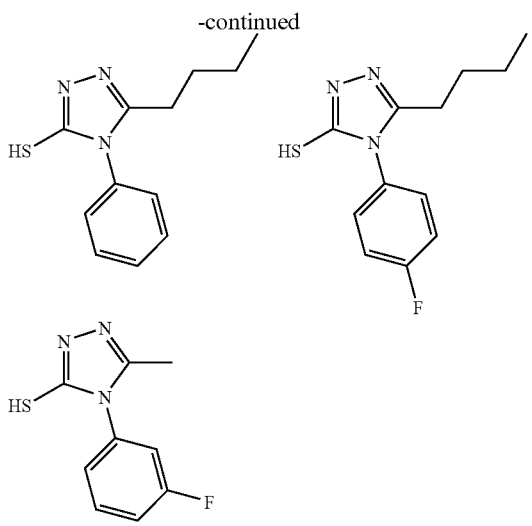

The mercapto compound represented by formula (1) can be synthesized according to a known method, for example, a method described in JP-A-5-124991. Also, commercially available compounds may be used.

The amount of the mercapto compound represented by formula (1) added is ordinarily from 0.5 to 20% by weight, preferably from 1 to 15% by weight, more preferably from 1 to 10% by weight, based on the total components constituting the photosensitive layer.

It is desirable to add a small amount of a thermal polymerization inhibitor to the photosensitive layer according to the invention in addition to the above-described basic components, in order to prevent the addition polymerizable compound having an ethylenically unsaturated double bond from undergoing undesirable thermal polymerization during the production or storage of the composition (photopolymerizable composition) for forming the photosensitive layer. Suitable examples of the thermal polymerization inhibitor include hydroquinone, p-methoxyphenol, di-tert-butyl-p-cresol, pyrogallol, tert-butylcatechol, benzoquinone, 4,4-thiobis(3-methyl-6-tert-butylphenol), 2,2'-methylenebis(4-methyl-6-tert-butylphenol), N-nitrosophenylhydroxyamine cerium(III) salt and N-nitrosophenylhydroxylamine aluminum salt. The amount of the thermal polymerization inhibitor added is preferably from about 0.01 to about 5% by weight based on the total components of the photopolymerizable composition. If desired, in order to avoid polymerization inhibition due to oxygen, a higher fatty acid derivative, for example, behenic acid or behenic amide may be added and allowed to localize on the polymerizable photosensitive layer surface during the drying step after the coating thereof. The amount of the higher fatty acid derivative added is preferably from about 0.5 to about 10% by weight based on the total components of the photopolymerizable composition.

Further, for the purpose of coloring the photosensitive layer, a coloring agent may be added thereto. Examples of the coloring agent include phthalocyanine pigments (for example, C.I. Pigment Blue 15:3, C.I. Pigment Blue 15:4 or C.I. Pigment Blue 15:6), azo pigments, pigments, for example, carbon black or titanium oxide, Ethyl Violet, Crystal Violet, azo dyes, anthraquinone dyes and cyanine dyes. The amount of the dye or pigment added is preferably from about 0.5 to about 5% by weight based on the total components of the photopolymerizable composition.

In addition, for the purpose of improving physical properties of the cured film, an additive, for example, an inorganic filler or a plasticizer (for example, dioctyl phthalate, dimethyl phthalate or tricresyl phosphate) may be added. The amount of the additive added is preferably 10% by weight or less based on the total components of the photopolymerizable composition.

Moreover, a surfactant can be added to the composition for forming the photosensitive layer in order to improve surface quality of the coating. A preferred surfactant includes, for example, a fluorine-based nonionic surfactant.

According to the invention, the photopolymerizable composition is applied to a support described hereinafter, which has been subjected to various kinds of surface treatments, if desired. In the application of the photopolymerizable composition to a support, the photopolymerizable composition is dissolved in a variety of organic solvents to apply. Examples of the solvent used include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propyolene glycol monoethyl ether acetate, 3-methoxypropyl acetate, N,N-dimethylformamide, dimethylsulfoxide, γ-butyrolactone, methyl lactate and ethyl lactate. The solvents may be used individually or as a mixture thereof. The concentration of solid content in the coating solution is appropriately from 1 to 50% by weight.

The coverage of the photosensitive layer is appropriately from about 0.1 to about 10 $g/m^2$, preferably from 0.3 to 5 $g/m^2$, more preferably from 0.5 to 3 $g/m^2$, in terms of weight after drying.

[Protective Layer]

On the photosensitive layer described above, an oxygen blocking protective layer (overcoat layer) is ordinarily provided in order to avoid polymerization inhibiting function of oxygen.

The coating amount of the protective layer according to the invention is preferably in a range of 0.7 to 3.0 $g/m^2$. When the coating amount is less than 0.7 $g/m^2$, the sensitivity may decrease. On the other hand, when it exceeds 3.0 $g/m^2$, burden of the treatment process may increase.

The protective layer is formed mainly from a water-soluble resin having the oxygen blocking property. Examples of the water-soluble vinyl polymer having the oxygen blocking property include polyvinyl alcohol, a partial ester, ether or acetal thereof and a copolymer thereof containing a substantial amount of an unsubstituted vinyl alcohol unit necessary for providing the water-solubility. Examples of the polyvinyl alcohol include ones which are hydrolyzed to an extent of 71 to 100% and which have a polymerization degree in the range of 300 to 2,400. Specifically, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8, all of which are manufactured by Kuraray Co., Ltd., are enumerated. The copolymer includes polyvinyl acetate chloroacetate or propionate, polyvinyl formal and polyvinyl acetal hydrolyzed to an extent of 88 to 100% and copolymers thereof. Other useful polymers include, for example, polyvinyl pyrrolidone, gelatin and gum arabic. The polymers may be used individually or in combination.

As a solvent used for coating the protective layer, though pure water is preferable, a mixture of pure water with an alcohol, for example, methanol or ethanol or a ketone, for example, acetone or methyl ethyl ketone may be used. The concentration of the solid content in the coating solution is appropriately from 1 to 20% by weight. To the protective layer may be added known additives, for example, a surfactant for improving coating property or a water-soluble plasticizer for improving physical property of the coated layer. Examples of the water-soluble plasticizer include propionamide, cyclohexanediol, glycerin and sorbitol. Also, a water-soluble (meth)acrylic polymer may be added.

The coverage of the protective layer is preferably from about 0.1 to about 15 $g/m^2$, more preferably from 1.0 to about 5 $g/m^2$, in terms of weight after drying.

[Hydrophilic Support]

As for the support used in the invention, although any support having a hydrophilic surface can be employed, it is preferably a dimensionally stable plate-like material, for example, paper, paper laminated with plastic (for example, polyethylene, polypropylene or polystyrene), a plate of metal (for example, aluminum (including an alloy thereof), zinc or copper) or alloy (for example, alloy of aluminum with silicon, copper, magnesium, chromium, zinc, lead, bismuth or nickel), a film of plastic (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal) and paper or a plastic film having laminated with or vapor-deposited thereon the above-described metal or alloy. Among these supports, the aluminum plate is particularly preferred, because it is extremely dimensional stable and relatively inexpensive. Also, a composite sheet comprising a polyethylene terephthalate film having bonded thereon an aluminum sheet described in JP-B-48-18327 is preferred. The thickness of the support is approximately from 0.05 to 1 mm.

In the case of using a support having a metal surface, particularly an aluminum surface, it is preferred that the support is subjected to surface treatment, for example, graining treatment, immersion treatment in an aqueous solution of sodium silicate, potassium fluorozirconate, a phosphate or the like, or anodizing treatment, described below.

(Graining Treatment)

A method for the graining treatment includes mechanical graining, chemical etching and electrolytic graining, as described in JP-A-56-28893. Specifically, there may be employed an electrochemically graining method of electrochemically graining the surface in an electrolytic solution of hydrochloric acid or nitric acid and a mechanical graining method, for example, a wire brush graining method of scratching the aluminum surface with a metal wire, a ball graining method of graining the aluminum surface with grinding balls and an abrasive and a brush graining method of graining the aluminum surface with a nylon brush and an abrasive. The graining methods may be employed individually or in combination thereof.

Of the methods, the electrochemical method of chemically graining the surface in an electrolytic solution of hydrochloric acid or nitric acid is an surface roughening method suitably used in the invention, and suitable current density is in a range of 100 to 400 $C/dm^2$. More specifically, it is preferred to conduct electrolysis in an electrolytic solution containing from 0.1 to 50% by weight hydrochloric acid or nitric acid under the conditions from 20 to 100° C. in temperature, from 1 second to 30 minutes in time and from 100 to 400 C/dm$^2$ in current density.

The aluminum support subjected to the graining treatment is then chemically etched with an acid or an alkali. The method of using an acid as an etching agent takes time for destroying fine structures and thus, it is disadvantageous to industrially apply the method to the invention. Such disadvantage can be overcome by using an alkali as the etching agent.

Examples of the alkali agent preferably used in the invention include sodium hydroxide, sodium carbonate, sodium aluminate, sodium metasilicate, sodium phosphate, potassium hydroxide and lithium hydroxide. Preferred ranges of concentration and temperature are form 1 to 50% by weight and 20 to 100° C., respectively. The alkali etching is preferably performed so that a dissolution amount of aluminum is in a range of 5 to 20 g/m$^3$.

After the etching procedure, the support is subjected to washing with an acid for removing stain (smut) remaining on the surface thereof. Examples of the acid for use in the acid-washing step include nitric acid, sulfuric acid, phosphoric acid, chromic acid, hydrofluoric acid and borohydrofluoric acid. In particular, as the method for removing smut after the electrochemical graining treatment, a method of bringing the aluminum support into contact with a 15 to 65% by weight aqueous solution of sulfuric acid having a temperature of 50 to 90° C. as described in JP-A-53-12739 and a method of performing alkali etching as described in JP-B-48-28123 are preferably exemplified.

In the invention, surface roughness (Ra) of the aluminum support is preferably from 0.3 to 0.7 μm.

(Anodizing Treatment)

The aluminum support thus-treated is then subjected to anodizing treatment. The anodizing treatment can be conducted in a manner conventionally used in the field of art.

Specifically, it is performed by applying a direct current or alternating current to the aluminum support in an aqueous solution or non-aqueous solution containing sulfuric acid, phosphoric acid, chromic acid, oxalic acid, sulfamic acid, benzenesulfonic acid or a combination of two or more thereof to form an anodic oxide layer on the surface of aluminum support.

The conditions of anodizing treatment cannot be determined in a general way, since they are widely varied depending on the electrolytic solution to be used. Ordinarily, however, a concentration of the electrolytic solution is in a range of 1 to 80%, a temperature of the electrolytic solution is in a range of 5 to 70° C., a current density is in a range of 0.5 to 60 ampere/dm$^2$, a voltage is in a range of 1 to 100 V, and a period of electrolysis is in a range of 10 to 100 seconds.

Of the anodizing treatments, a method of anodizing in a sulfuric acid solution with a high current density as described in British Patent 1,412,768 and a method of anodizing using phosphoric acid as an electrolytic bath as described in U.S. Pat. No. 3,511,661 are preferably used.

In the invention, the amount of anodic oxide layer is preferably from 1 to 10 g/m$^2$. When the amount is less than 1 g/m$^2$, the plate is apt to be scratched. On the other hand, when it exceeds 10 g/m$^2$, a lot of electricity is required for the production and thus, it is economically disadvantageous. The amount of anodic oxide layer is more preferably from 1.5 to 7 g/m$^2$, and still more preferably from 2 to 5 g/m$^2$.

In the invention, the aluminum support may further be subjected to sealing treatment after the graining treatment and anodizing treatment. The sealing treatment is performed by immersing the aluminum support in hot water or a hot aqueous solution containing an inorganic salt or an organic salt, or transporting the aluminum support in a water vapor bath. Moreover, the aluminum support for use in the invention may be subjected to surface treatment other than silicate treatment with an alkali metal silicate, for example, immersion treatment in an aqueous solution, for example, of potassium fluorozirconate or a phosphate.

According to the invention, to a support (in case of using an aluminum support, the aluminum support appropriately subjected to the above-described surface treatments is preferred), a polymerizable photosensitive layer comprising the above-described polymerizable photosensitive composition was applied and then a protective layer was preferably applied to prepare a photopolymerizable photosensitive lithographic printing plate. Before the application of the photopolymerizable photosensitive layer, if desired, an organic or inorganic subbing layer may be provided on the support, or the support may be subjected to a sol-gel treatment wherein a covalent bond of a functional group capable of generating an addition reaction upon a radical is formed as described in JP-A-7-159983.

A substance for forming the organic subbing layer includes, for example, a water-soluble resin, e.g., polyvinylphosphonic acid, a polymer or copolymer having a sulfonic acid group on the side chain thereof, polyacrylic acid, a water-soluble metal salt (e.g., zinc borate), a yellow dye and an amine salt.

More specifically, examples of the organic compound for use in the organic subbing layer include carboxymethyl cellulose, dextrin, gum arabic, a phosphonic acid having an amino group (for example, 2-aminoethylphosphonic acid), an organic phosphonic acid (for example, phenylphosphonic acid, naphthylphosphonic acid, alkylphosphonic acid, glycerophosphonic acid, methylenediphosphonic acid or ethylenediphosphonic acid, each of which may have a substituent), an organic phosphoric acid (for example, phenylphosphoric acid, naphthylphosphoric acid, alkylphosphoric acid or glycerophosphoric acid, each of which may have a substituent), an organic phosphinic acid (for example, phenylphosphinic acid, naphthylphosphinic acid, alkylphosphinic acid or glycerophosphinic acid, each of which may have a substituent), an amino acid (for example, glycine or β-alanine), and a hydrochloride of an amine containing a hydroxy group (for example, triethanolamine hydrochloride). The organic compounds may be used individually or as a mixture of two or more thereof.

The organic subbing layer can be provided in the following manner. Specifically, the organic compound as described above is dissolved in water, an organic solvent, for example, methanol, ethanol or methyl ethyl ketone, or a mixture thereof, the solution thus prepared is applied to the support and dried to form the organic subbing layer. Alternatively, the organic compound as described above is dissolved in water, an organic solvent, for example, methanol, ethanol or methyl ethyl ketone, or a mixture thereof, and the support is immersed in the solution thus prepared to adsorb the organic compound on the surface of support, then washed, for example, with water and dried to form the organic subbing layer. In the former method, the solution containing the organic compound in concentration of 0.005 to 10% by weight is coated by means of various methods. Any method, for example, bar coater coating, spin coating, spray coating or curtain coating can be employed. In the latter method, the concentration of the organic compound in the solution is preferably from 0.01 to 20% by weight, and more preferably from 0.05 to 5% by weight. The immersion temperature is preferably from 20 to 90° C., and more preferably from 25 to 50° C. The immersion time is preferably from 0.1 second to 20 minutes, and more preferably from 2 seconds to one minute.

The solution of organic compound may be used by adjusting the pH thereof in a range of 1 to 12 with a basic substance, for example, ammonia, triethylamine or potassium hydroxide, or an acidic substance, for example, hydrochloric acid or phosphoric acid. Further, a yellow dye may be added to the solution in order to improve tone reproducibility of the photopolymerizable photosensitive lithographic printing plate.

The coverage of the organic subbing layer after drying is preferably from 2 to 200 mg/m², and more preferably from 5 to 100 mg/m², in view of printing durability.

A substance for use in the inorganic subbing layer includes an inorganic salt, for example, cobalt acetate, nickel acetate or potassium fluorotitanate. The method for the formation of the inorganic subbing layer is same as that of the organic subbing layer described above.

[Plate-Making Process]

Now, a plate-making method for the photosensitive lithographic printing plate of the invention will be described in detail. As for the exposure method of the photosensitive lithographic printing plate, an AlGaInN semiconductor laser (commercially available InGaN semiconductor laser: 5 to 30 mW) is preferably used as a light source in view of wavelength characteristics and cost.

The exposure mechanism may be any of internal drum system, external drum system and flat bed system. When the photosensitive layer component of the photosensitive lithographic printing plate according to the invention used has high water solubility, the photosensitive layer can be made soluble in neutral water or alkalescent water, and the photosensitive lithographic printing plate having such a construction can be loaded on a printing machine and then subjected to exposure and development on the machine. After the imagewise exposure, the entire surface of the photosensitive lithographic printing plate may be heated, if desired, between the exposure and development. By means of heating, the image forming reaction in the photosensitive layer is accelerated and effects, for example, improvement in the sensitivity and printing durability and stabilization of the sensitivity are achieved. For the purpose of improving the image strength and printing durability, it is also effective to perform entire after-heating or entire exposure of the image after development. Ordinarily, the heating before development is preferably performed under a mild condition of 150° C. or lower. When the temperature is too high, a problem of fogging in the non-image area may occur. The heating after development uses a very strong condition, and it is ordinarily conducted in a temperature rage of 200 to 500° C. When the temperature is low, a sufficiently high effect of strengthening the image is not obtained, whereas when it is too high, problems, for example, deterioration of the support and thermal decomposition of the image area may occur.

(Developer)

The developer for use in the plate-making method of the photosensitive lithographic printing plate is not particularly restricted. However, for example, a solution containing an inorganic alkali salt and a nonionic surfactant and having a pH of from 11.0 to 12.7 is preferably used.

The inorganic alkali salt is appropriately used. Examples thereof include an inorganic alkali agent, for example, sodium hydroxide, potassium hydroxide, ammonium hydroxide, lithium hydroxide, sodium silicate, potassium silicate, ammonium silicate, lithium silicate, sodium tertiary phosphate, potassium tertiary phosphate, ammonium tertiary phosphate, sodium carbonate, potassium carbonate, ammonium carbonate, sodium hydrogencarbonate, potassium hydrogencarbonate, ammonium hydrogencarbonate, sodium borate, potassium borate and ammonium borate. The inorganic alkali salts may be used individually or in combination of two or more thereof.

In the case of using the silicate, developing property can be easily adjusted by selecting a mixing ratio of silicon oxide ($SiO_2$) to alkali oxide ($M_2O$ (wherein M represents an alkali metal or an ammonium group)), which are the components of the silicate, and the concentration thereof. Of the aqueous alkali solutions, an aqueous alkali solution having the mixing ratio of silicon oxide ($SiO_2$) to alkali oxide ($M_2O$) ($SiO_2/M_2O$ in molar ratio) of 0.5 to 3.0 is preferred, and that of 1.0 to 2.0 is more preferred. The amount of the $SiO_2/M_2O$ added is preferably from 1 to 10% by weight, more preferably from 3 to 8% by weight, most preferably from 4 to 7% by weight, based on the weight of the aqueous alkali solution. Specifically, the amount of 1% by weight or more is preferable in view of developing property and processing ability, and the amount of 10% by weight or less is preferable in view of inhibition of the formation of precipitates and crystals and prevention of gelation at neutralization of waste liquor of the developer, thereby causing no troubles in treatment of the waste liquor.

Also, an organic alkali agent may be supplementarily used for the purposes of delicate adjustment of alkali concentration and of assisting dissolution of the photosensitive layer. Examples of the organic alkali agent includes monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine and tetramethylammonium hydroxide. The organic alkali agents may be used individually or in combination of two or more thereof.

The surfactant is appropriately used. Examples thereof include nonionic surfactants, for example, a nonionic surfactant having polyoxyalkylene ether group, a polyoxyethylene alkyl ester (e.g., polyoxyethylene stearate), a sorbitan alkyl ester (e.g., sorbitan monolaurate, sorbitan monostearate, sorbitan distearate, sorbitan monooleate, sorbitan sesquioleate or sorbitan trioleate) and a monoglyceride alkyl ester (e.g., glycerol monostearate or glycerol monooleate); anionic surfactants, for example, an alkylbenzenesulfonate (e.g., sodium dodecylbenzenesulfonate), an alkylnaphthalenesulfonate (e.g., sodium butylnaphthalenesulfonate, sodium pentylnaphthalenesulfonate, sodium hexylnaphthalenesulfonate or sodium octylnaphthalenesulfonate), an alkylsulfate (e.g., sodium laurylsulfate), an alkylsulfonate (e.g., sodium dodecylsulfonate) and a sulfosuccinic acid ester salt (e.g., sodium dilaurylsulfosuccinate); and amphoteric surfactants, for example, an alkylbetaine (e.g., laurylbetaine or stearylbetaine) and an amino acid. Nonionic surfactants having a polyoxyalkylene ether group are particularly preferred.

As the surfactant having a polyoxyalkylene ether group, compounds having the structure represented by formula (I) shown below are preferably used.

$$R^{40}-O-(R^{41}-O)_pH \qquad (I)$$

In the formula, $R^{40}$ represents an alkyl group having from 3 to 15 carbon atoms, which may have a substituent, an aromatic hydrocarbon group having from 6 to 15 carbon atoms, which may have a substituent or a heteroaromatic ring group having from 4 to 15 carbon atoms, which may have a substituent. Examples of the substituent include an alkyl group having from 1 to 20 carbon atoms, a halogen atom, e.g., Br, Cl or I, an aromatic hydrocarbon group having from 6 to 15 carbon atoms, an aralkyl group having from 7 to 17 carbon atoms, an alkoxy group having from 1 to 20 carbon atoms, an alkoxycarbonyl group having from 2 to 20 carbon atoms and an acyl group having from 2 to 15 carbon atoms. $R^{41}$ represents an alkylene group having from 1 to 100 carbon atoms, which may have a substituent. Examples of the substituent include an alkyl group having from 1 to 20 carbon atoms and an aromatic hydrocarbon group having from 6 to 15 carbon atoms. p represents an integer of 1 to 100.

In the definition of the formula (I), specific examples of the "aromatic hydrocarbon group" include a phenyl group, a tolyl group, a naphthyl group, an anthryl group, a biphenyl group and a phenanthryl group, and specific examples of the "heteroaromatic ring group" include a furyl group, a thionyl group, an oxazolyl group, an imidazolyl group, a pyranyl group, a pyridinyl group, an acridinyl group, a benzofuranyl group, a benzothionyl group, a benzopyranyl group, a benzoxazolyl group and a benzimidazolyl group.

Also, the moiety of $(R^{41}-O)_p$ in the formula (I) may comprise two or three kinds of groups to the extent that the above-described definitions are fulfilled. Specifically, there may be illustrated a random or block chain of a combination of ethyleneoxy group and propyleneoxy group, a combination of ethyleneoxy group and isopropyleneoxy group, a combination of ethyleneoxy group and butyleneoxy group, and a combination of ethyleneoxy group and isobutyleneoxy group. In the invention, the surfactants having polyoxyalkylene ether group are used individually or in combination thereof. The surfactant is preferably added in an amount from 1 to 30% by weight, more preferably from 2 to 20% by weight, to the developer. The amount of 1% by weight or more is preferable in view of the developing property, and the amount of 30% by weight or less is preferable in view of prevention of decrease in the printing durability of a printing plate due to development damage.

Examples of the nonionic surfactant having polyoxyalkylene ether group represented by formula (I) include a polyoxyethylene alkyl ether, e.g., polyoxyethylene lauryl ether, polyoxyethylene cetyl ether or polyoxyethylene stearyl ether; a polyoxyethylene aryl ether, e.g., polyoxyethylene phenyl ether or polyoxyethylene naphthyl ether; and a polyoxyethylene alkylaryl ether, e.g., polyoxyethylene methylphenyl ether, polyoxyethylene octylphenyl ether or polyoxyethylene nonylphenyl ether.

The surfactants can be used individually or in combination thereof. Also, the amount of the surfactant used in the developer is preferably in the range from 0.1 to 20% by weight in terms of the solid content.

The pH of the developer used in the plate-making method according to the invention is preferably from 11.0 to 12.7, and more preferably from 11.5 to 12.5. By controlling the pH in the range from 11.0 to 12.7, the image formation is good, over development is prevented, and the damage of the exposed area during the development is restrained.

The electric conductivity of the developer used in the invention is preferably from 3 to 30 mS/cm. By controlling the electric conductivity in the range from 3 to 30 mS/cm, a dissolution rate of the photosensitive layer on the support surface can be adequately controlled, thereby preventing the formation of stain due to the remaining layer in the unexposed area. The electric conductivity is particularly preferably in the range from 5 to 20 mS/cm.

The development of the photosensitive lithographic printing plate according to the invention is conducted at a temperature from 0 to 60° C., preferably from about 15 to about 40° C., in a conventional manner, for example, by immersing the exposed photosensitive lithographic printing plate in the developer and rubbing with a brush.

Further, in the case of conducting the development processing using an automatic developing machine, since the developer becomes fatigued in accordance with the amount of processing, the processing ability may be restored by using a replenisher or a fresh developer.

The thus development-processed photosensitive lithographic printing plate is subjected to after-treatment with washing water, a rinse solution containing, for example, a surfactant, or a desensitizing solution containing, for example, gum arabic or a starch derivative, as described, for example, in JP-A-54-8002, JP-A-55-115045 and JP-A-59-58431. In the after-treatment of the photosensitive lithographic printing plate according to the invention, these treatments may be used in combination.

The printing plate thus-obtained in accordance with the above-described processing may be subjected to the after-exposure treatment described in JP-A-2000-89478 or a heating treatment, for example, baking, in order to improve the printing durability.

The lithographic printing plate thus-obtained is mounted on an offset printing machine to use for printing a large number of sheets.

EXAMPLES

The present invention will be described in more detail with reference to the following examples, but the invention should not be construed as being limited thereto.

Examples 1 to 5

[Example of Support 1]

(Support 1: Anodized Aluminum Support)

A 0.30-mm thick aluminum plate of 1S material was grained at the surface thereof using a No. 8 nylon brush and an aqueous suspension containing 800-mesh pumice stone, and then thoroughly washed with water. The plate was immersed in a 10% aqueous solution of sodium hydroxide at 70° C. for 60 seconds to etch, followed by washing with running water, neutralizing with 20% $HNO_3$, and then washing with water. The plate was then subjected to the electrolytic surface roughening treatment in a 1% nitric acid aqueous solution under the condition of VA=12.7 V at an anodic time electricity of 300 Coulomb/$dm^2$ using a current having an alternating sine wave form. The surface roughness was measured and found to be 0.45 μm (in terms of Ra). Subsequently, the plate was immersed in a 30% $H_2SO_4$ aqueous solution to desmut at 55° C. for 2 minutes. Then, the plate was anodized in a 20% $H_2SO_4$ aqueous solution of 33° C. at an electric current of 5 A/$dm^2$ for 50 seconds with disposing a cathode to the grained surface to form an anodic oxide film of 2.6 g/$m^2$ in thickness. This plate was referred to as Support 1.

(Support 2)

Subbing solution of Polymer (P1) shown below was coated on Support 1 using a bar coater so as to have a dry coating amount of 2 mg/$m^2$, followed by drying at 80° C. for 20 seconds.

[Subbing Solution]

| | |
|---|---|
| Polymer (P1) | 0.3 g |
| Pure water | 60.0 g |
| Methanol | 939.7 g |

Structure of Polymer (P1):

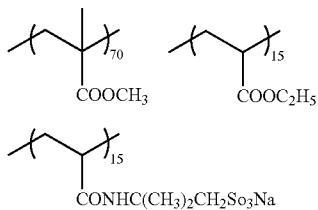

[Photopolymerizable Compositions P-1 to P-5]

Photopolymerizable Compositions P-1 to P-5 having the composition shown below were prepared. With respect to the binder polymer and mercapto compound, those shown in Table 1 below were used.

| | |
|---|---|
| Ethylenically unsaturated bond-containing compound (A-1) | 0.46 parts by weight |
| Binder Polymer (shown in Table 1 below) | 0.51 parts by weight |
| Sensitizing dye (D39 described hereinbefore) | 0.03 parts by weight |
| Bisimidazole (manufactured by Kurogane Kasei Co., Ltd.) | 0.12 parts by weight |
| ε-Phthalocyanine (F-1) dispersion | 0.47 parts by weight |
| Mercapto compound (shown in Table 1 below) | 0.09 parts by weight |
| Fluorine-based nonionic surfactant (Megafac F-780F, manufactured by Dainippon Ink & Chemicals, Inc.) | 0.009 parts by weight |
| Chlopen (manufactured by Wako Pure Chemical Industries, Ltd.) | 0.003 parts by weight |
| Methyl ethyl ketone | 7.4 parts by weight |
| Propylene glycol monomethyl ether | 7.4 parts by weight |

Ethylenically unsaturated bond-containing compound (A-1) and ε-Phthalocyanine (F-1) are compounds shown below.

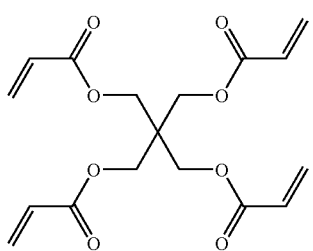

A-1

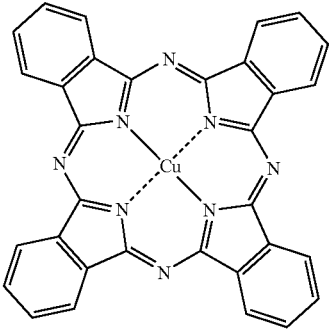

F-1

Bisimidazole used has the following structure:

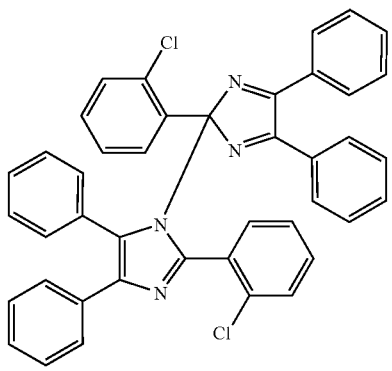

Each of the photopolymerizable compositions was coated on Support 2 using a bar coater and dried at 100° C. for one minute to prepare a photosensitive layer. The weight of the photosensitive layer after drying was 1.1 g/m².

On the photosensitive layer was coated an aqueous solution for protective layer containing 5.0 parts by weight of polyvinyl alcohol (PVA 205, saponification degree: 88% by mole; polymerization degree: 500; manufactured by Kuraray Co., Ltd.), 0.09 parts by weight of nonionic surfactant (EMALEX 710, manufactured by Nihon-Emulsion Co., Ltd.) and 94.91 parts by weight of pure water using a wire bar so as to have a dry coating amount of 2.4 g/m², followed by drying at 120° C. for one minute to form a protective layer. Thus, Photosensitive Lithographic Printing Plates 1 to 5 were prepared.

(Evaluation of Unevenness of Halftone Dot)

The photosensitive lithographic printing plate was loaded in a violet semiconductor laser setter Vx9600 (InGaN semiconductor laser: 405 nm±10 nm emission/output: 30 mW, manufactured by FUJIFILM Electronic Imaging, Ltd.), and thereon were drawn halftone dots of 35% using an FM screen (TAFFETA 20, manufactured by Fuji Photo Film Co., Ltd.) in an exposure amount of 90 µJ/cm² and resolution of 2,438 dpi. The exposed photosensitive lithographic printing plate was automatically conveyed to a connecting automatic developing machine (LP1250PLX), and it was heated at 100° C. for 10 seconds, washed with water to remove the PVA protective layer and then subjected to development processing at 28° C. for 20 seconds. The developer used was a solution prepared by diluting Developer DV-2 (manufactured by Fuji Photo Film Co., Ltd.) five times with water. The developed plate was washed with a rinse bath and conveyed to a gum coating bath containing a solution prepared by diluting Gum Solution FP-2W (manufactured by Fuji Photo Film Co., Ltd.) twice with water. After the gum coating, the plate was dried with hot air and discharged to obtain a lithographic printing plate having the halftone dots of 35% of FM screen drawn. A area ratio of the halftone dot of the lithographic printing plate was measured using CC-dot and an area difference (δ dot) between the maximum and the minimum was determined. The results are shown in Table 1.

Comparative Example 1

Photopolymerizable Composition P-6 was prepared in the same manner as in Photopolymerizable Composition P-1 except for using 2.0 parts by weight of Ethylenically unsaturated bond-containing compound (A-1), 1.0 part by weight of Binder polymer (B-4) shown below and Mercapto compound (C-1) shown below. Using Photopolymerizable Composition P-6 as a photosensitive layer, a photosensitive lithographic printing plate was prepared and the δ dot was determined in the same manner as in Example 1. The result is shown in Table 1 below.

TABLE 1

| | Photosensitive Layer | | Unevenness of Halftone Dot |
|---|---|---|---|
| | Binder Polymer | Mercapto Compound | δ dot (%) |
| Example 1 | B-3 | S-1 | 1.5 |
| Example 2 | B-3 | S-2 | 1.5 |
| Example 3 | B-1 | S-1 | 1.0 |
| Example 4 | B-1 | S-2 | 0.5 |
| Example 5 | B-2 | S-2 | 2.5 |
| Comparative Example 1 | B-4 | C-1 | 8.5 |

TABLE 1-continued

| | Photosensitive Layer | | Unevenness of Halftone Dot |
|---|---|---|---|
| | Binder Polymer | Mercapto Compound | δ dot (%) |

From the results shown in Table 1, it can be seen that the photosensitive lithographic printing plate of the invention exhibits excellent performance of small unevenness of halftone dot even in the laser exposure using an FM screen.

This application is based on Japanese Patent application JP 2005-45910, filed Feb. 22, 2005, the entire content of which is hereby incorporated by reference, the same as if set forth at length.

What is claimed is:

1. A photosensitive lithographic printing plate comprising a hydrophilic support and a photopolymerizable photosensitive layer containing the following components (i) to (v):
    (i) a sensitizing dye having an absorption maximum in a wavelength range of from 360 to 450 nm;
    (ii) a hexaarylbisimidazole compound;
    (iii) an addition polymerizable compound having an ethylenically unsaturated double bond;
    (iv) a binder polymer; and
    (v) a mercapto compound represented by the following formula (1):

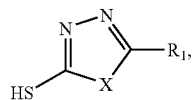

(1)

wherein $R_1$ represents a group containing an aromatic ring and having from 6 to 20 carbon atoms; and X represents $N(R_2)$— in which $R_2$ represents a straight chain or branched alkyl group having from 1 to 18 carbon atoms, an alkyl group containing an alicyclic structure and having from 5 to 20 carbon atoms or a group containing an aromatic ring and having from 6 to 20 carbon atoms.

2. The photosensitive lithographic printing plate as claimed in claim 1, wherein the binder polymer comprises three structure units represented by the following formulae (B1) to (B3):

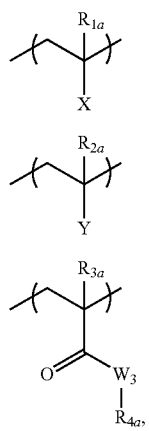

(B1)

(B2)

(B3)

wherein $R_{1a}$, $R_{2a}$ and $R_{3a}$ each independently represents a hydrogen atom or an alkyl group having from 1 to 6 carbon atom; X represents a functional group selected from —COOH, —CO—$W_1$-$L_1$-COOH and —$SO_3$H in which $W_1$ represents an oxygen atom, a sulfur atom or —NH— and $L_1$ represents a divalent organic group; Y represents —CO—O—$CH_2$—CH=$CH_2$ or —CO—$W_2$-$L_2$-O—CO—C($R_0$)=$CH_2$ in which $W_2$ represents an oxygen atom, a sulfur atom or —NH—, $L_2$ represents a divalent organic group and $R_0$ represents a hydrogen atom or an alkyl group having from 1 to 6 carbon atom; $W_3$ represents an oxygen atom, a sulfur atom or —NH—; and $R_{4a}$ represents a straight chain or branched alkyl group having from 1 to 18 carbon atoms, an alkyl group containing an alicyclic structure and having from 5 to 20 carbon atoms or a group containing an aromatic ring and having from 6 to 20 carbon atoms.

3. The photosensitive lithographic printing plate as claimed in claim 1, wherein a ratio of a content of the component (iii) contained in the photopolymerizable photosensitive layer to a content of the component (iv) contained in the photopolymerizable photosensitive layer is 1.0 or less.

4. The photosensitive lithographic printing plate as claimed in claim 2, wherein a ratio of a content of the component (iii) contained in the photopolymerizable photosensitive layer to a content of the component (iv) contained in the photopolymerizable photosensitive layer is 1.0 or less.

5. The photosensitive lithographic printing plate as claimed in claim 1, further comprising an overcoat layer containing a water-soluble resin, so that the hydrophilic support, the photopolymerizable photosensitive layer and the overcoat layer are in this order.

6. The photosensitive lithographic printing plate as claimed in claim 1, wherein the binder polymer has a weight average molecular weight of from 5,000 to 300,000 and an acid value of from 0.5 to 200.

7. The photosensitive lithographic printing plate as claimed in claim 6, wherein the binder polymer has an acid value of from 5.0 to 180.

8. The photosensitive lithographic printing plate as claimed in claim 6, wherein the binder polymer has an acid value of from 10 to 150.

9. The photosensitive lithographic printing plate as claimed in claim 2, wherein a weight ratio of a total amount of the structure unit represented by the formula (B1) and the structure unit represented by the formula (B3) to an amount of the structure unit represented by the formula (B2) is from 0.1 to 3.0.

10. The photosensitive lithographic printing plate as claimed in claim 2, wherein a weight ratio of a total amount of the structure unit represented by the formula (B1) and the structure unit represented by the formula (B3) to an amount of the structure unit represented by the formula (B2) is from 0.1 to 2.0.

* * * * *